United States Patent
Yeh et al.

(10) Patent No.: US 8,158,335 B2
(45) Date of Patent: Apr. 17, 2012

(54) HIGH ETCH RESISTANT MATERIAL FOR DOUBLE PATTERNING

(75) Inventors: Hsiao-Wei Yeh, Hsinchu (TW);
Ching-Yu Chang, Yilang (TW);
Jian-Hong Chen, Hsinchu (TW);
Chih-An Lin, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 689 days.

(21) Appl. No.: 12/210,737

(22) Filed: Sep. 15, 2008

(65) Prior Publication Data

US 2010/0068656 A1    Mar. 18, 2010

(51) Int. Cl.
*G03F 7/26* (2006.01)

(52) U.S. Cl. .................................. 430/315; 430/394

(58) Field of Classification Search .................. 430/322, 430/312, 315, 323, 394, 330
See application file for complete search history.

(56) References Cited

U.S. PATENT DOCUMENTS

| | | | |
|---|---|---|---|
| 2004/0009436 A1* | 1/2004 | Lee et al. | 430/313 |
| 2008/0032508 A1* | 2/2008 | Chang | 438/725 |
| 2008/0248427 A1* | 10/2008 | Thiyagarajan et al. | 430/287.1 |

FOREIGN PATENT DOCUMENTS

| | | | |
|---|---|---|---|
| EP | 0097063 | * | 12/1983 |
| JP | 2008-083537 | * | 4/2008 |

* cited by examiner

*Primary Examiner* — Kathleen Duda
*Assistant Examiner* — Caleen Sullivan
(74) *Attorney, Agent, or Firm* — Haynes and Boone, LLP (57) ABSTRACT

The present invention includes a lithography method comprising forming a first patterned insist layer including at least one opening therein over a substrate. A water-soluble polymer layer is formed over the first patterned resist layer and the substrate, whereby a reaction occurs at the interface of the first patterned resist layer and the water-soluble polymer layer. The non-reacted water-soluble polymer layer is removed. Thereafter, a second patterned resist layer is formed over the substrate, wherein at least one portion of the second patterned resist layer is disposed within the at least one opening of the first patterned resist layer or abuts at least one portion of the first patterned resist layer. The substrate is thereafter etched using the first and second patterned resist layers as a mask.

17 Claims, 5 Drawing Sheets

HIGH ETCH RESISTANT MATERIAL FOR DOUBLE PATTERNING

CROSS-REFERENCE

The present disclosure is related to the following commonly-assigned U.S. patent application, the entire disclosure of which is hereby incorporated herein by reference: U.S. patent application Ser. No. 11/209,684, entitled "METHOD FOR FORMING HIGH ETCH RESISTANT DOUBLE EXPOSURE PATTERNS," having Ching-Yu Chang named as the inventor.

BACKGROUND

Semiconductor technologies are continually progressing to smaller feature sizes, down to 65 nanometers, 45 nanometers, and below. A patterned photoresist layer used to produce such small feature sizes typically has a high aspect ratio. Maintaining a desired critical dimension (CD) can be very difficult for various reasons. For example, because resist materials ace susceptible to the etching process, they may suffer from pattern collapse and CD degradation during a photolithography patterning process. When double patterning techniques are utilized, additional issues may be brought out, such as round corners, resist pattern collapse, etching resistance, poor topography, exposure focusing errors, high manufacturing costs, and low throughput.

SUMMARY

The present invention includes a lithography method comprising forming a first patterned resist layer including at least one opening therein over a substrate. A water-soluble polymer layer is formed over the first patterned resist layer and the substrate, whereby a reaction occurs at the interface of the first patterned resist layer and the water-soluble polymer layer. The non-reacted water-soluble polymer layer is removed. Thereafter, a second patterned resist layer is formed over the substrate, wherein at least one portion of the second patterned resist layer is disposed within the at least one opening of the first patterned resist layer or abuts at least one portion of the first patterned resist layer. The substrate is thereafter etched using the first and second patterned resist layers as a mask.

BRIEF DESCRIPTION OF THE DRAWINGS

The features, aspects, and advantages of the present invention will become more fully apparent from the following detailed description, appended claims, and accompanying drawings in which:

DETAILED DESCRIPTION

It is understood that the following disclosure provides different embodiments, or examples, for implementing different features of various embodiments. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the fast and second features, such that the first and second features may not be in direct contact. In some instances, well-known structures, materials, and processes have not been described in detail to avoid unnecessarily obscuring the present invention.

The disclosure presents a double patterning method using a water-soluble polymer material or a water-soluble cross-linkable material in place of conventional alcohol-based materials to create a resist pattern with an overall enhanced etch resistance that can be used to create fine granularity features needed for sub-micron semiconductor devices. With reference to FIGS. 1-8, a method for lithography patterning is described showing one embodiment of a device 2 during various stages of fabrication.

Figure 1:
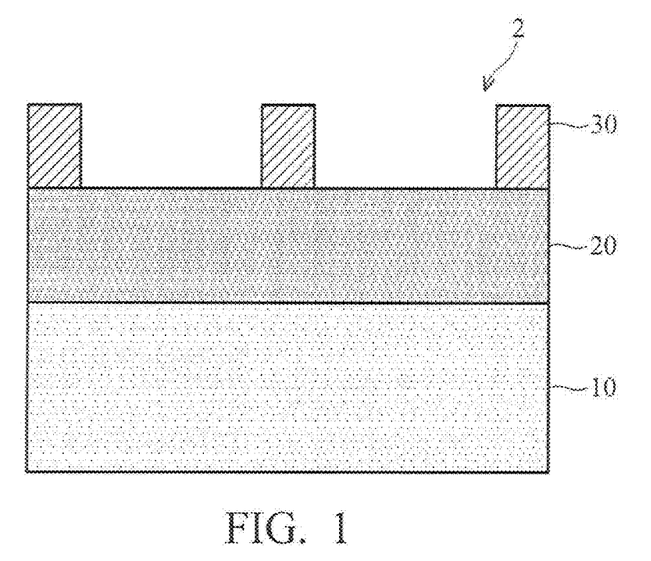
FIGS. 1-8 are sectional views of one embodiment of a device during various fabrication stages thereof.

FIG. 1 shows a semiconductor device 2 having a silicon substrate 10. The substrate 10 may alternatively be made of some other suitable semiconductor material, including Ge, SiGe, or GaAs. Further, the substrate 10 may alternatively be made of some other suitable elementary semiconductor such as diamond; a suitable compound semiconductor such as silicon carbide, indium arsenide, or indium phosphide; or a suitable alloy semiconductor such as silicon germanium carbide, gallium arsenic phosphide, or gallium indium phosphide. The substrate 10 may include various doped legions, dielectric features, and multilevel interconnects. The substrate 10 may alternatively be a non-semiconductor material such as a glass substrate for thin-film-transistor liquid crystal display (TFT-LCD) devices, or fused quartz or calcium fluoride for a photomask (mask or reticle). The substrate 10 may include a layer to be patterned such as a dielectric layer, a semiconductor layer, or a poly-silicon layer.

An optional material layer 20 is formed on substrate 10 and may function as a hard mask, HMDS, and/or a bottom antireflective coating (BARC). Material layer 20 has a thickness ranging from about 5 angstroms to about 9000 angstroms in one embodiment. For example, the thickness of material layer 20 can be about 500 angstroms. In another embodiment, material layer 20 has a thickness ranging from about 500 angstroms to about 3500 angstroms. Further, material layer 20 may have other parameters that fall within selected ranges. For example, material layer 20 has a refractive index in a range between about 1 and 3, and an extinction coefficient (absorption value) κ in a range from about 0.01 to about 1.0. In one embodiment, the extinction coefficient κ has a range of from about 0.1 to about 0.5. Alternatively, material layer 20 may have a refractive index of about 1.75 and an extinction coefficient of about 0.2.

In the present embodiment, material layer 20 includes an organic polymer. Material layer 20 may be substantially free of silicon. Material layer 20 may include a photoresist (or resist) that is either positive-type or negative-type, with or without photosensitive material. Material layer 20 may include a proper BARC material and may further have a top layer to cover the BARC material. The top layer may be about 50 angstroms thick, and substantially free of hydroxyl groups and carboxyl groups. Material layer 20 may include conventional polymer material or resist material. For example, material layer 20 may be one of t-Butyloxycarbonyl (t-BOC) resist, acetal resist, and environmentally stabilized chemically amplified photoresist (ESCAP) that are known in the art. For the material layer 20 made of polymeric material, the polymeric material may be cross-linked. For example, the polymeric material can be spin-on coated or deposited by chemical vapor deposition (CVD) to the substrate 10 and then cross-linked using a baking process with temperature ranging from between about 90° C. to about 300° C. Alternatively, this temperature range could be about 100° C. to about 180° C. The polymeric material may also be of the non-cross-linked type, and in that case material layer 20 may use a solvent that is not capable of dissolving a resist layer or not dissolved by the resist layer formed above the material layer 20. For example, material layer 20 may use butanol as a solvent.

Alternatively, material layer 20 may use other suitable materials that are different from a protective layer that is to be formed above material layer 20 to protect a resist pattern on material layer 20. For example, material layer 20 may include silicon nitride or silicon oxynitride in order to be different from a protective layer containing silicon oxide, in which the two layers have substantially different etching rates during an etching process.

A first patterned resist layer 30 is then formed on material layer 20. First patterned resist layer 30 includes a plurality of openings, such that portions of material layer 20 are uncovered within the openings. The openings of first patterned resist layer 30 are configured according to a predetermined pattern. The first patterned resist layer 30 may have a thickness ranging from between about 50 angstroms to about 5,000 angstroms. Alternatively, the first patterned resist layer 30 may have a thickness ranging between about 500 angstroms to about 2000 angstroms. First patterned resist layer 30 may be a positive-type resist or a negative-type resist. For advanced semiconductor patterning using an extreme ultraviolet (EUV) radiation beam, the first patterned resist layer 30 may use a chemically amplified (CA) resist. First patterned resist layer 30 is formed by a lithography process that may include processing steps of resist coating, soft baking, mask aligning, exposing, post-exposure bake (PEB), developing, and hard baking. For illustration, the exposing process may be carried out by exposing the semiconductor device 2 under a radiation beam through a mask having a predefined pattern (or a reversed pattern). The radiation beam may be ultraviolet (UV) or extreme ultraviolet (EUV), such as a 248 nm beam from a Krypton Fluoride (KrF) excimer laser, or a 193 nm beam from an Argon Fluoride (ArF) excimer laser. The lithography process may utilize other exposing modes or technologies, such as on-axis, off-axis, quadripole, or dipole exposure technologies. The lithography patterning may alternatively be implemented or replaced by other proper methods such as maskless lithography, immersion lithography, electron-beam writing, ion-beam writing, and molecular imprint techniques.

The material for first patterned resist layer 30 may be one which has a mechanism for generating an acid component inside the resist by exposure to heat or light. For example, first patterned resist layer 30 is a positive resist and may include methacrylate resin, acrylate resin, novolac resin and a naphthoquinonediazide photosensitive agent. Further, a chemically amplified resist which make use of an acid generating mechanism may also be used as first patterned resist layer 30. Other types of resist materials may also be used for first patterned resist layer 30 so far as they utilize reaction systems of generating an acid by an appropriate application of heat or light.

First patterned resist layer 30 may be further processed using a hardening process. The hardening process may include plasma treatment, ultraviolet (UV) cueing, ion implant bombardment, e-beam treatment, or combinations thereof.

Figure 2:
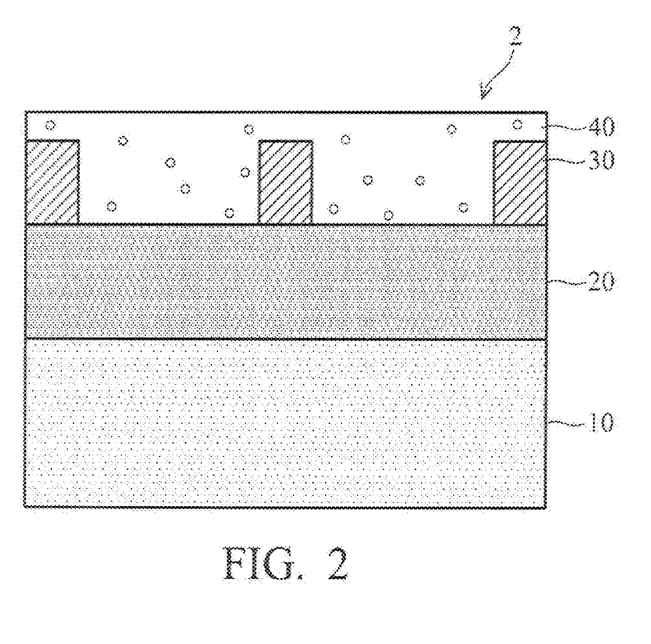

With reference now to FIG. 2, a protective layer 40 is formed on material layer 20 by conventional spin coating, for example to increase the etch resistance and/or insolubility of first patterned resist layer 30. Protective layer 40 substantially fills the openings in first patterned resist layer 30. Protective layer 40 substantially covers portions of material layer 20 that are exposed within the openings in first patterned resist layer 30 and has a thickness that covers the first patterned resist layer 30. For example, protective layer 40 may have a thickness in the range of from about 100 angstroms to about 2000 angstroms.

In one embodiment, the protective layer 40 comprises a water-soluble polymer layer. In another embodiment, the protective layer 40 comprises a water-soluble cross-linkable material layer. Alcohol-based protective layers are conventionally utilized in the process of enhancing the etch resistance of the resist layer. Being that such materials are more hydrophobic than water, in a subsequent development process, the resist layers are more soluble and prone to damage resulting in round corners, top loss, and CD bias. One aspect of the present disclosure is the use of a water-soluble protective layer having a $T_g$ (glass transition temperature) of <150° C. Such protective layer is more hydrophilic than an alcohol-based layer resulting in less damage to the resist layer, less top loss, round corners, and resist pattern degradation.

In addition to comprising a water-soluble polymer or a water-soluble cross-linkable layer, protective layer 40 may also include an acid generator, base generator, surfactant, terminator, and/or a cross-linking agent. In one embodiment, the cross-linking agent includes a material having functional groups selected from the group consisting of: —OH; —COOH; and —(C=O)O—R.

The water-based protective layer 40 may also include a silicon-rich material. In another embodiment, protective layer 40 includes an organic polymer. The organic polymer may contain, for example single-bond, double-bond, and triple-bond materials including benzyl or phenyl group polymers, silicon molecular or silicon polymer or combinations thereof. These bonds increase the etch resistance. The organic polymer and silicon containing polymer have substantially higher etch resistances compared to normal polymers which have less than a double bond structure, tertiary carbon structure, or do not contain silicon. The polymeric material of the organic polymer may be cross-linked. The protective layer 40 may be thermally baked for cross-linking. Where the protective layer 40 includes a silicon-containing polymer, the polymer may include a silicon-containing material, carbide, a metal containing material, polymer, or combinations thereof. In other embodiments, the metal containing material contains metal such as titanium, titanium nitride, aluminum, tantalum, silicon, copper, Tungsten, tantalum nitride, and combinations thereof. In other embodiments, the silicon-containing material may include silicon oxide, silicon carbide, silicon nitride, silicon oxynitride, and combinations thereof. After coating of the protective layer 40, device 2 may be baked, for example, at from about 80 Celsius to about 230 Celsius for from about 10 seconds to about 120 seconds.

By way of a reactionary step such as, for example cross-linking, diffusion, chemical bonding, ionic bonding, and dipole-dipole interaction that occurs at the interface of the first patterned resist layer 30 and protective layer 40, first patterned resist layer 30 can be made more etch resistant and/or more solvent resistant such that first patterned resist layer 30 is made insoluble in subsequent processing steps such as for example, coating of a second resist layer on first patterned resist layer 30 or during a developing step.

Figure 3:
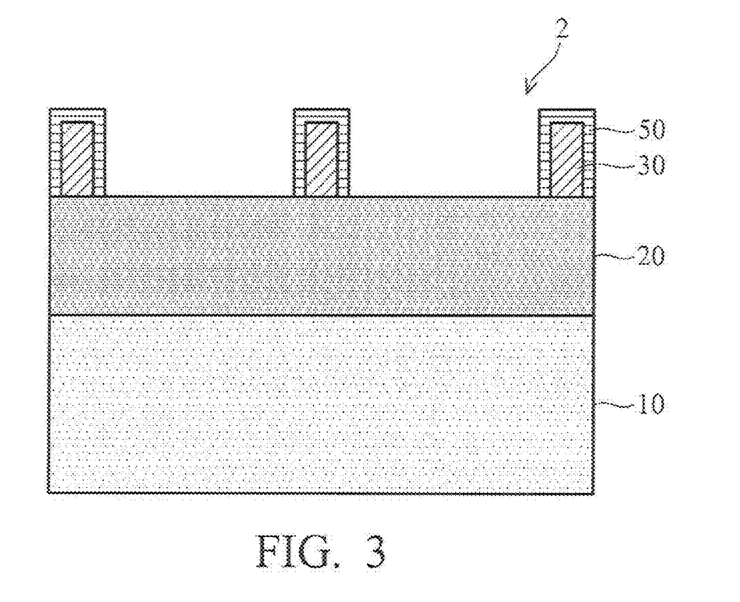

In a cross-linking reactionary process, upon exposure to heat or light, acid atoms diffuse from first patterned resist layer 30 into protective layer 40 and a cross-linking reaction occurs at the interface of the first patterned resist layer 30 and the protective layer 40. Alternatively, the acid may come from an optional acid treatment step or optical treatment step to produce the cross-linking reaction if the photoresist layer does not itself contain sufficient acid. FIG. 3 shows a reaction layer or cross-linked layer 50 formed over or in first patterned resist layer 30 following a development process to remove portions of the non-reacted or non cross-linked protective layer 40. It is understood that a large portion of the water-soluble protective layer 40 that is not cross-linked remains unaffected by the acid reaction and will be removed by a liquid developer. The cross-linking reaction between first patterned resist layer 30 and protective layer 40 and the thickness of the cross-linked layer 50 formed over first patterned resist layer 30 may be controlled as desired. The cross-linking reaction should be optimized depending on the reactivity between first patterned resist layer 30 and protective layer 40, the shape and thickness of first patterned resist layer 30, and the intended thickness of the cross-linked layer 50. The effective process control of the cross-linking reaction may be done by the control of the mixing bake temperature and treating time, Especially, when the heating and cross-linking time is controlled, the thickness of the cross-linked layer can be controlled. This method ensures a very good reaction control. In one embodiment, device 2 is thermally treated to a temperature of from about 80 Celsius to about 250 Celsius for from about 15 seconds to about 300 seconds. In another embodiment, device 2 is thermally treated to a temperature of from about 110 Celsius to about 160 Celsius for from about 30 seconds to about 90 seconds. In one embodiment, the cross-linked layer 50 has a thickness ranging from about 10 angstroms to about 400 angstroms. The thermal treatment may be by way of ultra-violet, infrared, heat, hot plate, mega sonic, microwave, heating coil and future developed heating methods.

In place of or prior to the thermal treatment described above, cross-linked layer 50 may be formed over first patterned resist layer 30 by application of light. The light source used may include, for example Hg lamps, a KrF excimer; an ArF excimer and the like, depending on the sensitizing wavelength of first patterned resist layer 30. The light source is not critical so far as an acid is generated by exposure to light, and an appropriate light source or exposure may be selected depending on the sensitizing wavelength of first patterned resist layer 30.

In a diffusion process for creating a reaction layer 50 over first patterned resist layer 30, protective layer 40 may include Si, Ti, Ta as described above and single bond, double bond, and triple bond materials such as benzyl or phenyl group polymers, for example. The protective layer 40 may also include a cross linker such as, for example amine, diamine polymer or tri-amine polymer to form cross linking with the first patterned resist layer 30. The thermal treatment may be by way of ultra-violet, infrared, heat, hot plate, mega sonic, microwave, heating coil and future developed heating methods. The thermal treatment causes polymer molecules, atoms and/or silicon atoms to substantially diffuse from protective layer 40 into first patterned resist layer 30, thereby enhancing the latter's etch resistance as well as making first patterned resist layer 30 substantially insoluble to subsequent processing steps. In one embodiment, semiconductor device 2 is thermally treated at a temperature ranging from about 50° C. to about 250° C. for about 10 seconds to about 5 minutes. In another embodiment, device 2 is thermally treated at a temperature ranging from about 100° C. to about 150° C. for about 60 seconds to about two minutes. In another embodiment, device 2 is thermally treated by conventional mega sonic power of from about 10 to 1000 Kw/Hz for about five seconds to about five minutes.

Reaction layer 50 may also be formed over first patterned resist layer 30 by way of a chemical bonding process. According to one aspect of the present disclosure, a functional group in the protective layer 40 reacts with the functional group in the first patterned resist layer 30 to form reaction layer 50. In one embodiment, the functional group of the protective layer 40 includes hydroxyl and amine and the functional group of the first patterned resist layer 30 includes lactone, carboxylic acid, and hydroxyl group. Following the chemical reaction, a thermal treatment may be performed to increase the resist pattern etch resistance in subsequent processing steps. The thermal treatment process may be by way of a hard plate baking. In one embodiment, semiconductor device 2 is baked at a temperature in the range of from about 80° C. to about 250° C. for a time of from about 15 seconds to about 2 minutes. In another embodiment, the semiconductor device 2 is baked at a temperature in the range of from about 110° C. to about 150° C. for a time of from about 60 seconds to about 90 seconds.

Following the reactionary step, FIG. 3 shows the removal of the non-reacted portions of the protective layer 40 leaving a reaction layer 50 formed over or in first patterned resist layer 30. The non-reacted portions of second layer 40 may be removed by conventional and future-developed solvents such as, for example, a liquid developer such as de-ionized water, TMAH (tetra methyl ammonium hydroxide), isobutanol solvent, isopentanol solvent, isopropyl alcohol (IPA), propylene glycol monomethyl ether (PGME), cyclopentanol, propylene glycol monomethyl ether acetate (PGMEA), and cyclo-hexanol. The liquid developer is applied to remove the non-reacted layer of the water-soluble protective layer 40, but does not affect the reaction layer 50. After completing the development, an optional post-developing baking may be performed on device 2 to further enhance the etch and solvent resistancy of first patterned resist layer 30. In one embodiment, device 2 may be thermally treated at a temperature of from about 80° C. to about 150° C. for about 30 seconds to about 120 seconds. An optional second baking process may be performed on device 2 following die post developing baking to further enhance the cross-linking and solvent resistance of the first patterned resist layer 30. In one embodiment, device 2 may be thermally treated to a temperature of from about 100° C. to about 250° C. for about 30 seconds to about 120 seconds.

Figure 4:
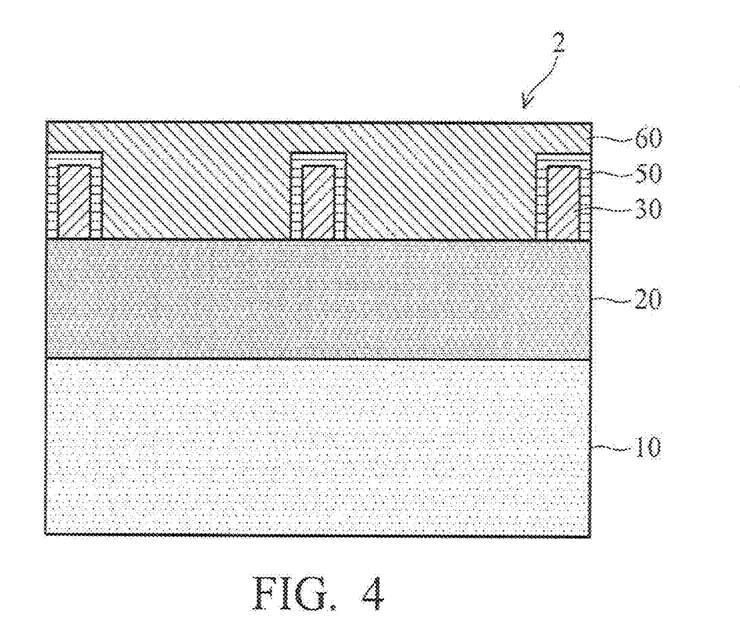
Figure 5:
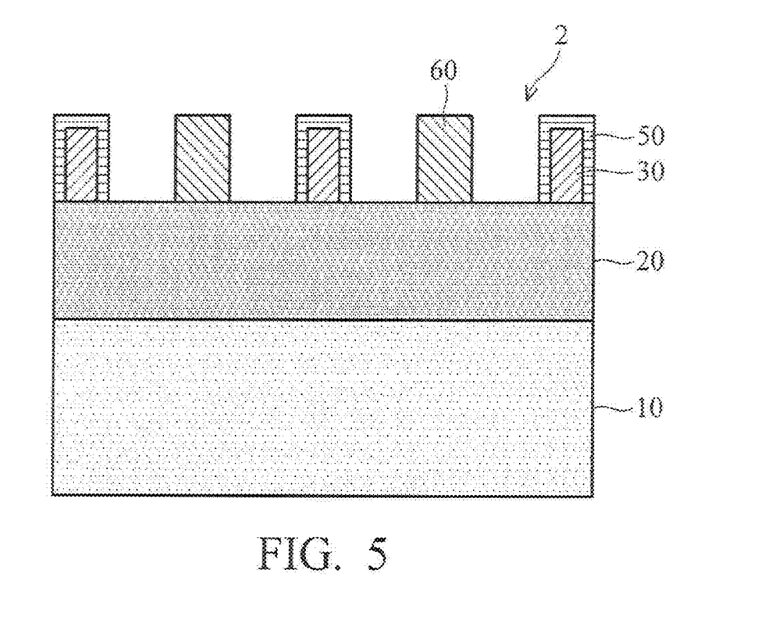

The formation of a second patterned resist layer 60 on material layer 20 by a second lithography process is shown in FIGS. 4 and 5. As shown in FIG. 4, a second resist layer is formed above material layer 20 slid first patterned resist layer 30 and followed possibly by heating the resist layer to, for example, evaporate solvent. The desired pattern is then transferred to the resist layer by exposing the resist layer using, for example, an immersion lithography tool. After an optional post-exposure bake is performed, the exposed resist layer is developed using a developer rinse. A subsequent water rinse then removes the unwanted portions of the resist layer, leaving the first and second patterned resist layers 30 and 60, respectively, on material layer 20 as shown in FIG. 5. In one embodiment of the present disclosure as depicted in FIG. 5, one portion of the second patterned resist layer 60 is disposed within one opening of the first patterned resist layer 30. In another embodiment, one portion of the second patterned resist layer 60 abuts at least one portion of the first patterned resist layer 30 (not shown).

Aspects of the disclosure allow the critical dimension (CD) of the first patterned resist layer 30 shown in FIG. 5 to remain substantially unchanged to the CD of the first patterned resist layer 30 shown in FIG. 1. Second patterned resist layer 60 may be substantially similar to first patterned resist layer 30 in terms of function, formation, and composition. The second patterned resist layer 60, like the first patterned resist layer 30, includes a plurality of second resist features and a plurality of openings defined by the second resist features, such that portions of material layer 20 not covered by the first and second resist patterns are exposed. The second resist features are configured according to another predetermined IC structure defined on a mask. In one embodiment, the second resist features are positioned such that one of the second resist features is interposed between two adjacent features of the first resist pattern. Similarly, two adjacent features of the second resist pattern is interposed by one of the first resist features.

The second patterned resist layer 60 is configured relative to first patterned resist layer 30 so as to utilize a double patterning structure. The openings in the first and second patterned resist layers 30 and 60, respectively, may be configured to achieve pitch splitting. After the formation of both the first and second resist patterns, a pitch, defined from the one feature of the first resist pattern to an adjacent feature of the second resist pattern, is halved, resulting in a reduced minimum features size. In one embodiment, a pitch from a feature of the first patterned resist layer to adjacent one of the second patterned resist layer is less than about 200 nm. In another embodiment, a pitch from a feature of the first patterned resist layer to adjacent one of the second patterned resist layer is less than about 1 µm. The openings defined by the first patterned resist layer 30 and the second patterned resist layer 60 may be configured to form various contact holes or trenches for metal interconnects.

Figure 6:
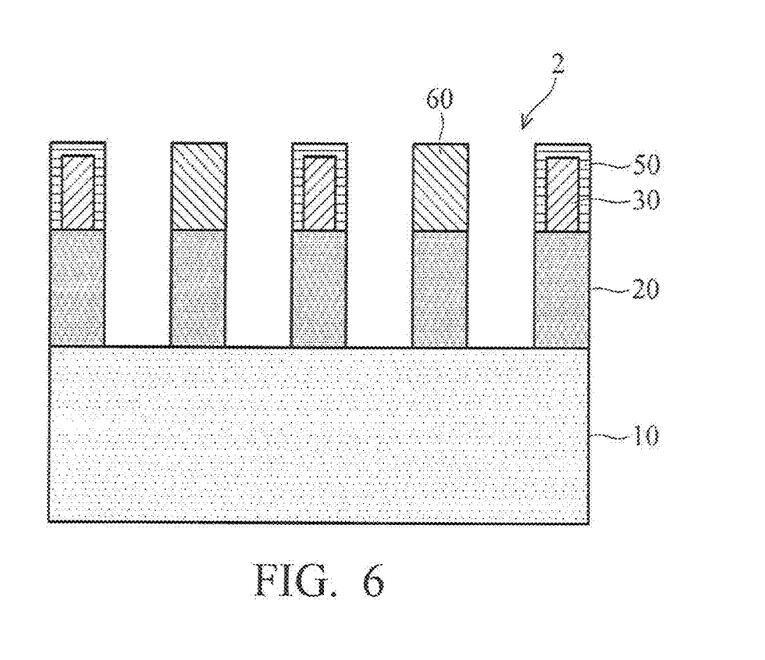

Referring now to FIG. 6, using the first and second patterned resist layers 30 and 60, respectively, as a mask, an etching process is applied to remove material layer 20 within the openings of first and second patterned resist layers 30 and 60, respectively. A suitable etching process, such as, for example a wet chemical etch or a dry plasma stripping may be used. In one embodiment, the etch process may use a $CF_4$, $C_3F_8$, $C_4F_8$, $CHF_3$, $CH_2F_2$ dry etch or a buffered hydrofluoric acid (BHF), ammonia peroxide mixture (APM), hydrochloride peroxide mixture, ammonia water, hydrochloride water, acid solution, base solution wet etch. In another embodiment, the etch process may use nitrogen plasma or a mixture of oxygen, hydrogen, carbon fluoride, carbon bromide and nitrogen plasma.

Figure 7:
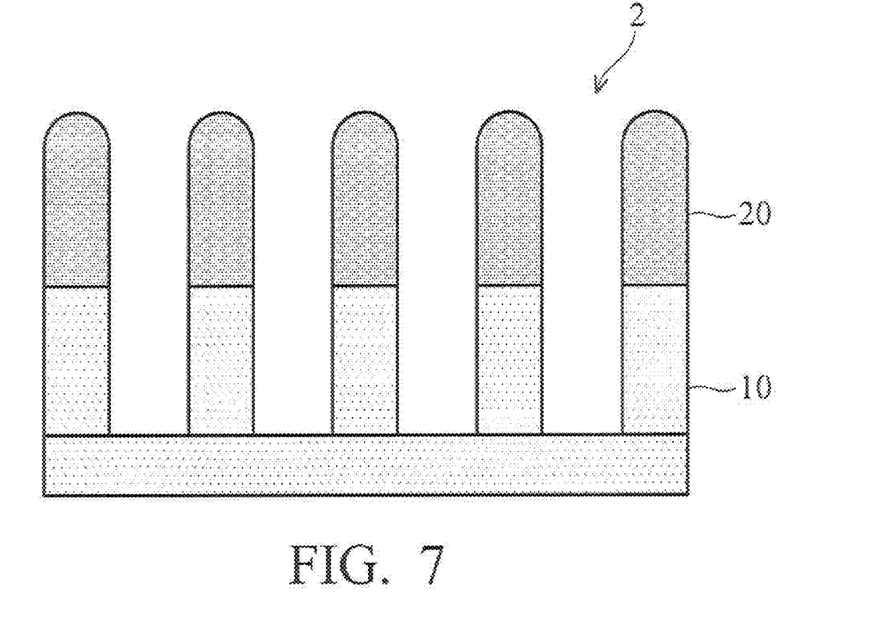
Figure 8:
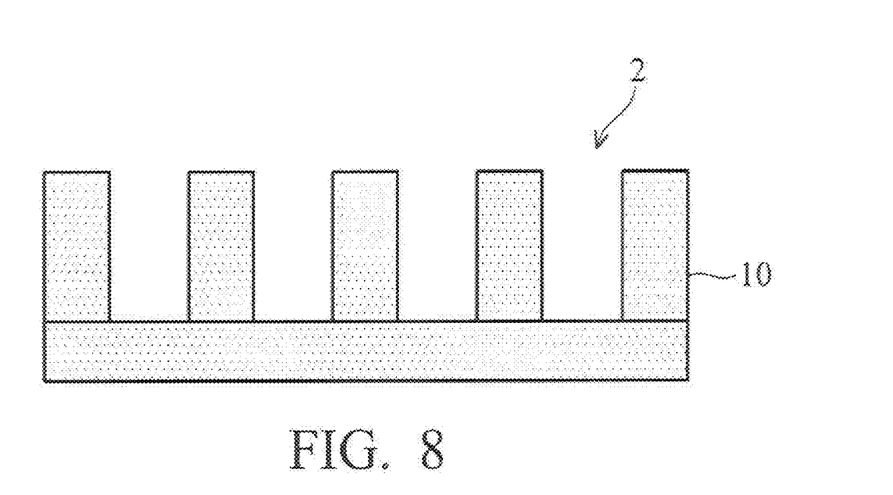

Referring to FIG. 7, the substrate 10 is further etched through using a suitable etching process such as, for example a dry etch or a wet etch. The first and second patterned resist layers 30 and 60, respectively, will be consumed and at least some of material layer 20 may be consumed during the etching process. The remainder of material layer 20 is thereafter removed, as illustrated in FIG. 8.

Figure 9:
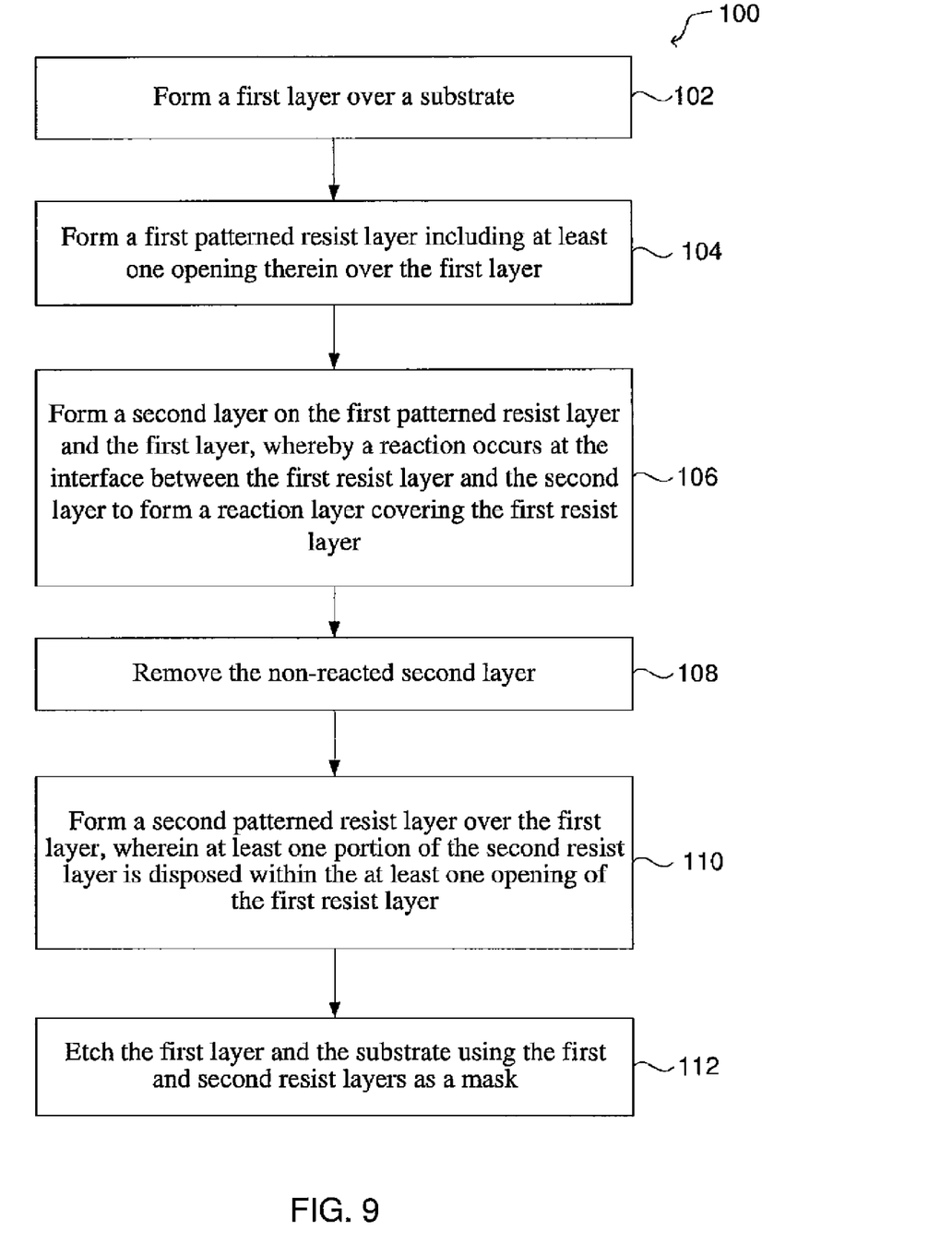
FIG. 9 is a flowchart showing one embodiment of a method of lithography patterning.

FIG. 9 is a flowchart showing an embodiment of a method 100 of lithography patterning, which is the lithography patterning described above in association with FIGS. 1-8. The method 100 begins at step 102 by forming a first patterned resist layer including at least one opening therein over a substrate. At step 104, a water-soluble polymer layer is formed over the first patterned resist layer and the substrate, whereby a reaction occurs at the interface of the first patterned resist layer and the water-soluble polymer layer. At step 106, the non-reacted water-soluble polymer layer is removed. At step 108, a second patterned resist layer is formed over the substrate, wherein at least one portion of the second patterned resist layer is disposed within the at least one opening of the first patterned resist layer or abuts at least one portion of the first patterned resist layer. At step 110, the substrate is etched using the first and second resist layers as a mask. Various changes, additions, substitutions and alterations can be made in this method without departing from the spirit and scope of the present disclosure.

The disclosure presents a double patterning method using a water-soluble polymer material or a water-soluble cross-linkable material in place of conventional materials to create a resist pattern with an overall enhanced etch resistance that can be used to create fine granularity features needed for sub-micron semiconductor devices. The use of these materials results in a patterned resist layer less prone to top loss, round corners, and resist pattern degradation.

Various embodiments of a lithography patterning process have been introduced and described. Other modifications, variations, additions, and extensions may be used without departing from the scope of the disclosure. For example, a hardening process may be applied to a resist layer using a plasma treatment, UV curing, ion implantation, or e-beam treatment. In another example, a resist layer, a silicon-containing layer, or a metal-containing layer may use a different solvent to avoid mixing or interdiffusion. All of the above techniques that include hardening and utilizing different solvents may be alternatively implemented, or combined, depending on the configuration and the processing procedure.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments disclosed herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A lithography method comprising:
    forming a first patterned resist layer including at least one opening therein over a substrate, wherein the first patterned resist layer does not itself contain sufficient acid;
    performing a hardening process to the first patterned resist layer;
    forming a water-soluble polymer layer over the first patterned resist layer and the substrate, wherein the forming of the water-soluble polymer layer includes performing an acid treatment to the water-soluble polymer layer, whereby a reaction occurs at the interface of the first patterned resist layer and the water-soluble polymer layer; and
    forming a second patterned resist layer over the substrate, wherein at least one portion of the second patterned resist layer is disposed within the at least one opening of the first patterned resist layer or abuts at least one portion of the first patterned resist layer.

2. The method of claim 1, further comprising removing the non-reacted water-soluble polymer layer using a liquid develop selected from the group consisting of tetra methyl ammonium hydroxide (TMAH), isobutanol solvent, isopentanol solvent, propylene glycol monomethyl ether (PGME), cyclopentanol, propylene glycol monomethyl ether acetate (PGMEA), and cyclo-hexane.

3. The method of claim 1, wherein the performing of the hardening process includes performing one selected from the group consisting of plasma treatment, ultraviolet (UV) curing, ion implant bombardment, e-beam treatment and combinations thereof.

4. The method of claim 1, wherein the water-soluble polymer layer comprises an acid generator.

5. The method of claim 1, wherein the water-soluble polymer layer comprises a surfactant.

6. The method of claim 1, wherein the water-soluble polymer layer comprises a terminator.

7. The method of claim 1, wherein the water-soluble polymer layer comprises a cross-linking agent.

8. The method of claim 7, wherein the cross-linking agent comprises a material having functional groups selected from the group consisting of —OH; —COOH; and —(C=O)OR—R.

9. The method of claim 1, wherein the water-soluble polymer layer has a $T_g$ (glass transition temperature) <150° C.

10. The method of claim 1, wherein a pitch from a feature of the first patterned resist layer to adjacent one of the second patterned resist layer is less than about 1 μm.

11. A lithography method comprising:
forming a first patterned resist layer including at least one opening therein over a substrate, wherein the first patterned resist layer does not itself contain sufficient acid;
depositing a water-soluble cross-linkable material layer over the first patterned resist layer and the substrate, wherein the depositing includes performing an acid treatment to the water-soluble polymer layer;
performing an optical treatment to the water-soluble cross-linkable material layer, whereby a reaction occurs at the interface of the first patterned resist layer and the water-soluble cross-linkable material layer to form a reaction layer over the first patterned resist layer; and
forming a second patterned resist layer over the substrate, wherein at least one portion of the second patterned resist layer is disposed within the at least one opening of the first patterned resist layer or abuts at least one portion of the first patterned resist layer.

12. The method of claim 11, further comprising removing the non-reacted water-soluble cross-linkable material layer.

13. The method of claim 11, wherein the performing of the optical treatment includes applying light from a light source selected from the group consisting of Hg lamp, KrF excimer and ArF excimer.

14. The method of claim 11 wherein the cross-linkable material layer comprises a material capable of reacting with the functional groups selected from the group consisting of —COOH— and —(C=O)O—R.

15. The method of claim 11, wherein the water-soluble cross-linkable material layer comprises an acid generator.

16. The method of claim 11, wherein the water-soluble cross-linkable material layer comprises a terminator.

17. The method of claim 11, wherein a pitch from a feature of the first patterned resist layer to adjacent one of the second patterned resist layer is less than about 1 μm.

* * * * *